(12) United States Patent
Kang et al.

(10) Patent No.: US 8,345,464 B2
(45) Date of Patent: Jan. 1, 2013

(54) RESISTIVE MEMORY DEVICES HAVING A STACKED STRUCTURE AND METHODS OF OPERATION THEREOF

(75) Inventors: Sang Beom Kang, Hwaseong-si (KR); Chul Woo Park, Yongin-si (KR); Hyun Ho Choi, Suwon-si (KR); Ho Jung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 341 days.

(21) Appl. No.: 12/714,950

(22) Filed: Mar. 1, 2010

(65) Prior Publication Data

US 2010/0226165 A1 Sep. 9, 2010

(30) Foreign Application Priority Data

Mar. 6, 2009 (KR) .................. 10-2009-0019193

(51) Int. Cl.
*G11C 11/00* (2006.01)

(52) U.S. Cl. .................................... 365/148
(58) Field of Classification Search .......... 365/148, 365/189.011
See application file for complete search history.

(56) References Cited

U.S. PATENT DOCUMENTS

| 6,954,394 | B2* | 10/2005 | Knall et al. ............... 365/211 |
| 2005/0226037 | A1* | 10/2005 | Nejad et al. ............... 365/158 |
| 2007/0025151 | A1* | 2/2007 | Lee ............... 365/185.11 |
| 2008/0316819 | A1* | 12/2008 | Lee ............... 365/185.03 |
| 2009/0201740 | A1* | 8/2009 | Willer et al. ............... 365/185.18 |
| 2009/0219750 | A1* | 9/2009 | Tokiwa et al. ............... 365/148 |

FOREIGN PATENT DOCUMENTS

| KR | 1020070014470 A | 2/2007 |
| KR | 1020070024702 A | 3/2007 |
| KR | 1020080048534 A | 6/2008 |

* cited by examiner

*Primary Examiner* — Huan Hoang
*Assistant Examiner* — Min Huang
(74) *Attorney, Agent, or Firm* — Myers Bigel Sibley & Sajovec, P.A.

(57) ABSTRACT

A memory device includes a stacked resistive memory cell array comprising a plurality of resistive memory cell layers stacked on a semiconductor substrate, wherein respective memory cell layers are configured to store data according to respective program modes comprising a number of bits per cell. The memory device further includes a control circuit configured to identify a program mode of a selected memory cell layer responsive to an address signal and to access the selected memory cell layer responsive to the address signal according to the identified program mode. The program modes may include a single-level cell mode and at least one multi-level cell mode.

17 Claims, 11 Drawing Sheets

RESISTIVE MEMORY DEVICES HAVING A STACKED STRUCTURE AND METHODS OF OPERATION THEREOF

CROSS-REFERENCE TO RELATED APPLICATION(S)

This application claims priority under 35 USC §119 to Korean Patent Application No. 2009-0019193, filed on Mar. 6, 2009, in the Korean Intellectual Property Office (KIPO), the contents of which are incorporated herein in its entirety by reference.

BACKGROUND

Some embodiments relate to semiconductor memory devices and methods of operation thereof and, more particularly, to resistive memory devices and methods of operation thereof.

Semiconductor memory devices for storing data may be classified into volatile memory devices and non-volatile memory devices. The volatile memory devices are typically configured to store data by charging or discharging capacitors in memory cells, and widely used as main memories of various apparatuses. Volatile memory devices, such as Dynamic Random Access Memory (DRAM) and Static Random Access Memory (SRAM) retain stored data while power is supplied and lose the stored data when power is off. Non-volatile memory devices, such as flash memory devices, may maintain stored data even though power is off, and widely used for storing program codes and/or data in computers, mobile devices, etc.

To address demands for high memory capacity, high operation speed and low power consumption, memory devices of various types have been developed that potentially offer high integration density like DRAM, high speed like SRAM and non-volatility like flash memory in the same device. For example, Phase Change Random Access Memory (PRAM) (which uses phase change materials), Resistance Random Access Memory (RRAM) (which uses materials having variable resistance such as transition-metal oxides), and Magnetic Random Access Memory (MRAM) (which uses ferromagnetism materials) are attracting attention as potential next-generation memory devices. The memory storage materials used in such devices share common characteristics, such as resistance that is variable depending on magnitude and/or direction of applied voltage and/or current, with the resistance being maintained without requiring sustained applied voltage and/or current (e.g., refresh is not required).

Memory cells such resistive memory devices may be formed with one resistive element and one switching element so that data may be stored by controlling voltage and/or current of a bitline and a wordline to change resistance of the resistive element. The resistive memory cells may be classified into PRAM, RRAM, MRAM, etc. depending on materials forming the resistive element of the memory cell. For example, the resistive element of a PRAM cell may include phase change materials such as Ge—Sb—Te, resistance of which is varied depending on temperature. The resistive element of a RRAM cell may include a top electrode, a bottom electrode and transition-metal oxides between the top and bottom electrodes. The resistive element of a MRAM cell may include a magnetic top electrode, a magnetic bottom electrode and dielectric materials between the top and bottom electrodes. To potentially reduce chip size, resistive memory devices with stacked structures including resistive memory cell layers stacked on a semiconductor substrate have been developed.

SUMMARY

According to some embodiments, a memory device includes a stacked resistive memory cell array comprising a plurality of resistive memory cell layers stacked on a semiconductor substrate, wherein respective memory cell layers are configured to store data according to respective program modes comprising a number of bits per cell. The memory device further includes a control circuit configured to identify a program mode of a selected memory cell layer responsive to an address signal and to access the selected memory cell layer responsive to the address signal according to the identified program mode. The program modes may include a single-level cell mode and at least one multi-level cell mode.

In some embodiments, the control circuit is configured to store program information for the plurality of memory cell layers and to identify the program mode of the selected memory cell layer based on the stored program information. The program information may identify an address corresponding to a program mode. The control circuit may be configured to compare the address signal with the identified address to identify the program mode of the selected memory cell layer. For example, the control circuit may be configured to identify the program mode of the selected memory cell layer as a single-level cell mode if the address signal corresponds to an address less than the identified address and to identify the program mode of the selected memory cell layer as a multi-level cell mode if the address signal corresponds to an address greater than the identified address.

In some embodiments, a resistive memory cell layer located directly on the semiconductor substrate stores data in a single-level cell mode. In some embodiments, the control circuit is configured to generate a row control signal and a column control signal responsive to the address signal and the identified program mode. The control circuit may be configured to generate a layer selection signal indicating the selected memory cell layer to identify a single-level cell mode or a multi-level cell mode for the selected memory cell layer based on the row control signal, the column control signal and the layer selection signal. The memory device may further include a row decoder configured to generate a wordline driving signal corresponding to the program mode of the selected memory cell layer based on the row control signal and the layer selection signal and configured to apply the wordline driving signal to the selected memory cell layer and a column decoder configured to generate a column selection signal corresponding to the program mode of the selected memory cell layer based on the column control signal and the layer selection signal and to apply the column selection signal to the selected memory cell layer. The memory device may also include an input/output circuit configured to provide input data to the selected memory cell layer in the single-level cell mode or the multi-level cell mode in response to the column control signal and the layer selection signal during a write operation and to read output data from the selected memory cell layer in the single-level cell mode or the multi-level cell mode in response to the column control signal and the layer selection signal during a read operation.

In some embodiments, the control circuit includes a program mode setting circuit configured to generate a program mode signal indicating the program mode of the selected memory cell layer based on the address signal and a timing and voltage level control circuit configured to generate the row control signal and the column control signal based on the address signal and the program mode signal. The control circuit may further include a memory cell layer selecting circuit configured to generate a layer selection signal indicating the selected memory cell layer based on the row control signal and the column control signal.

In some embodiments, the stacked resistive memory cell array comprises a program information storage portion configured to store program information about the program modes of the resistive memory cell layers. The control circuit may be configured to access the program information storage portion to identify the program mode of the selected memory cell layer.

Further embodiments provide a memory system including a memory controller configured to generate an address signal and a resistive memory comprising a plurality of resistive memory cell layers stacked on a semiconductor substrate, respective ones of the memory cell layers configured to store data according to respective program modes comprising a number of bits per cell. The resistive memory is further configured to identify a program mode of a selected memory cell layer responsive to the address signal and to access the selected memory cell layer responsive to the address signal according to the identified program mode. The program modes may include a single-level cell mode and at least one multi-level cell mode.

Still further embodiments provide methods of operating a resistive memory comprising a plurality of resistive memory cell layers stacked on a semiconductor substrate, respective ones of the memory cell layers configured to store data according to respective program modes comprising a number of bits per cell. The methods include identifying a program mode of a selected memory cell layer responsive to an address signal and accessing the selected memory cell layer responsive to the address signal according to the identified program mode. Identifying a program mode of a selected memory cell layer responsive to an address signal may include accessing program information stored in the resistive memory device responsive to the address signal. The program information may be stored in the plurality of memory cell layers or in a register. The program information may include an address associated with a program mode.

Some embodiments provide a resistive memory device having a stacked structure, capable of setting cell types of resistive memory cell layers.

Some embodiments provide a memory system including a resistive memory device having a stacked structure.

Some embodiments provide a method of setting cell types of resistive memory cell layers in a resistive memory device having a stacked structure According to some embodiments, a resistive memory device having a stacked structure includes a stacked resistive memory cell array and a control circuit. The stacked resistive memory cell array includes a plurality of resistive memory cell layers stacked on a semiconductor substrate. The control circuit stores program information about program modes of the resistive memory cell layers, selects one layer corresponding to an address signal from the resistive memory cell layers, extracts a program mode of the selected layer based on the program information, and generates a row control signal and a column control signal based on the program mode of the selected layer and the address signal.

Each of the program modes may be one of a single-level cell mode and a multi-level cell mode.

The program information may include a start address of a multi-level cell start layer that is set to a multi-level cell mode.

The control circuit may compare the address signal with the start address to extract the program mode of the selected layer.

The control circuit may set the selected layer to a single-level cell mode if the address signal indicates an address less than the start address, and the control circuit may set the selected layer to the multi-level cell mode if the address signal indicates an address no less than the start address.

A resistive memory cell layer located directly on the semiconductor substrate may be set to a single-level cell mode.

The control circuit may generate a layer selection signal indicating the selected layer, and may set the selected layer to one of a single-level cell mode and a multi-level cell mode based on the row control signal, the column control signal and the layer selection signal.

The resistive memory device may further include a row decoder configured to generate a wordline driving signal corresponding to the program mode of the selected layer based on the row control signal and the layer selection signal, and configured to provide the wordline driving signal to the selected layer, and a column decoder configured to generate a column selection signal corresponding to the program mode of the selected layer based on the column control signal and the layer selection signal, and configured to provide the column selection signal to the selected layer.

The resistive memory device may further include an input/output circuit configured to provide input data to the selected layer in one of the single-level cell mode and the multi-level cell mode in response to the column control signal and the layer selection signal during a write operation, and configured to read output data from the selected layer in the one of the single-level cell mode and the multi-level cell mode in response to the column control signal and the layer selection signal during a read operation.

The control circuit may include a program mode setting circuit configured to generate a program mode signal indicating the program mode of the selected layer based on the address signal and the program information, and a timing and voltage level control circuit configured to generate the row control signal and the column control signal based on the address signal and the program mode signal.

The control circuit may further include a memory cell layer selecting circuit configured to generate a layer selection signal indicating the selected layer based on the row control signal and the column control signal.

The control circuit may further include a register configured to store the program information.

According to some embodiments, a resistive memory device having a stacked structure includes a stacked resistive memory cell array and a control circuit. The stacked resistive memory cell array includes a plurality of resistive memory cell layers stacked on a semiconductor substrate, and further includes a program information storage portion for storing program information about program modes of the resistive memory cell layers. The control circuit reads the program information from the program information storage portion, selects one layer corresponding to an address signal from the resistive memory cell layers, extracts a program mode of the selected layer based on the program information, and generates a row control signal and a column control signal based on the program mode of the selected layer and the address signal.

The program information stored in the program information storage portion may include a start address of a multi-level cell start layer that is set to a multi-level cell mode.

One or more resistive memory cell layers having addresses less than the start address may be set to single-level cell modes, and one or more resistive memory cell layers having addresses no less than the start address may be set to multi-level cell modes.

The program information stored in the program information storage portion may be read and provided to the control circuit by a sense amplifier included in an input/output circuit.

According to some embodiments, a memory system includes a memory controller and a resistive memory device having a stacked structure. The memory controller generates an address signal and a command signal. The resistive memory device performs a write operation or a read operation based on the address signal and the command signal. The resistive memory device stores program information about program modes of resistive memory cell layers, selects one layer corresponding to the address signal from the resistive memory cell layers, extracts a program mode of the selected layer based on the program information, and performs the write operation or the read operation in one of a single-level cell mode and a multi-level cell mode based on the program mode of the selected layer, the address signal and the command signal.

In a method of setting cell types of a plurality of resistive memory cell layers stacked on a semiconductor substrate, according to some embodiments, program information about program modes of the resistive memory cell layers is stored. One layer corresponding to an address signal is selected from the resistive memory cell layers. A program mode of the selected layer is extracted based on the program information. A row control signal and a column control signal are generated based on the program mode of the selected layer and the address signal.

A layer selection signal indicating the selected layer may be generated. A wordline driving signal corresponding to the program mode of the selected layer may be generated based on the row control signal and the layer selection signal. A column selection signal corresponding to the program mode of the selected layer may be generated based on the column control signal and the layer selection signal. The wordline driving signal and the column selection signal may be provided to the selected layer.

The program information may be read from a program information storage portion included in the resistive memory cell layers.

BRIEF DESCRIPTION OF THE DRAWINGS

Illustrative, non-limiting some embodiments will be more clearly understood from the following detailed description taken in conjunction with the accompanying drawings.

DETAILED DESCRIPTION OF THE EMBODIMENTS

Figure 1:
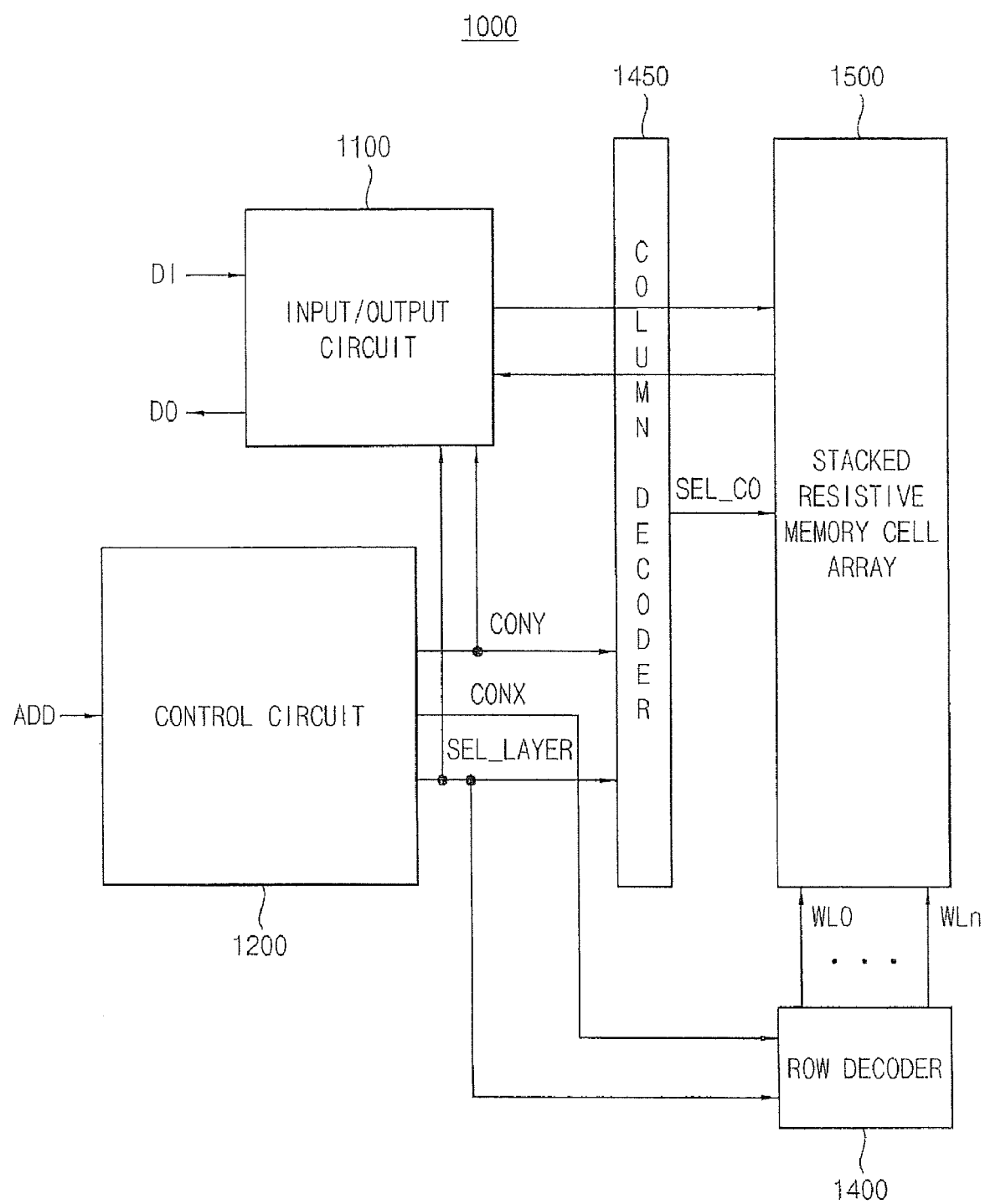
FIG. 1 is a block diagram illustrating a resistive memory device having a stacked structure according to some embodiments.

Various some embodiments will be described more fully hereinafter with reference to the accompanying drawings, in which some embodiments are shown. The present inventive subject matter may, however, be embodied in many different forms and should not be construed as limited to the some embodiments set forth herein. Rather, these some embodiments are provided so that this disclosure will be thorough and complete, and will fully convey the scope of the present inventive subject matter to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular some embodiments only and is not intended to be limiting of the present inventive subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a resistive memory device having a stacked structure according to some embodiments.

Referring to FIG. 1, a resistive memory device 1000 includes an input/output circuit 1100, a control circuit 1200, a row decoder 1400, a column decoder 1450, and a resistive memory cell array 1500.

The resistive memory cell array 1500 has a stacked structure including a plurality of resistive memory cell layers. The resistive memory cell layers may be stacked on a semiconductor substrate. Each resistive memory cell layer includes a plurality of resistive memory cells disposed in rows and columns.

The control circuit 1200 may store program information about program modes of the resistive memory cell layers. The program modes may include a single-level cell mode or a multi-level cell mode. The program information may be provided from a memory controller or from the resistive memory cell array 1500 to the control circuit 1200 during an initialization process. The program information stored in the control circuit 1200 may be updated by the memory controller.

In some embodiments, the program information may include only a start address of a multi-level cell start layer. The multi-level cell start layer may be the lowest layer of resistive memory cell layers that are set to multi-level cell modes. Resistive memory cell layers located below the multi-level cell start layer may be set to single-level cell modes, and resistive memory cell layers located above the multi-level cell start layer may be set to multi-level cell modes. A program mode of each resistive memory cell layer may be extracted based on addresses assigned to the resistive memory cell layer and the start address. For example, if the addresses assigned to the resistive memory cell layer are less than the start address, the program mode of the resistive memory cell layer may be determined as the single-level mode. If the addresses assigned to the resistive memory cell layer are no less than the start address, the program mode of the resistive memory cell layer may be determined as the multi-level mode.

The control circuit 1200 may select one resistive memory cell layer from the resistive memory cell layers in response to an address signal ADD, and may extract a program mode of the selected resistive memory cell layer from the program information. The control circuit 1200 may generate a row control signal CONX and a column control signal CONY based on the program mode of the selected resistive memory cell layer and the address signal ADDR. The control circuit 1200 may generate a layer selection signal SEL_LAYER indicating the selected resistive memory cell layer.

The row decoder 1400 may generate wordline driving signals WL0 through WLn by decoding the row control signal CONX and the layer selection signal SEL_LAYER, and may apply the wordline driving signals WL0 through WLn to the selected resistive memory cell layer in the resistive memory cell array 1500. The column decoder 1450 may generate a column selection signal SEL_CO by decoding the column control signal CONY and the layer selection signal SEL_LAYER, and may apply the column selection signal SEL_CO to the selected resistive memory cell layer in the resistive memory cell array 1500.

The input/output circuit 1100 may provide input data DI to the selected resistive memory cell layer in the resistive memory cell array 1500 in response to the column control signal CONY and the layer selection signal SEL_LAYER during a write operation. The input/output circuit 1100 may perform the write operation according to the program mode of the selected resistive memory cell layer. For example, if the program mode of the selected resistive memory cell layer is a single-level cell mode, the input/output circuit 1100 may write the input data DI to the selected resistive memory cell layer with timing and voltage levels corresponding to the single-level cell mode. If the program mode of the selected resistive memory cell layer is a multi-level cell mode, the input/output circuit 1100 may write the input data DI to the selected resistive memory cell layer with timing and voltage levels corresponding to the multi-level cell mode.

The input/output circuit 1100 may generate output data DO by sensing and amplifying bitline voltages from the selected resistive memory cell layer in response to the column control signal CONY and the layer selection signal SEL_LAYER during a read operation. The input/output circuit 1100 may perform the read operation according to the program mode of the selected resistive memory cell layer. For example, if the program mode of the selected resistive memory cell layer is a single-level cell mode, the input/output circuit 1100 may read the output data DO from the selected resistive memory cell layer with timing and voltage levels corresponding to the single-level cell mode. If the program mode of the selected resistive memory cell layer is a multi-level cell mode, the input/output circuit 1100 may read the output data DO from the selected resistive memory cell layer with timing and voltage levels corresponding to the multi-level cell mode.

The input/output circuit 1100 may include a sense amplifier for the read operation and a write driver for the write operation.

The program mode of each resistive memory cell layer indicates a cell type of resistive memory cells included in each resistive memory cell layer in the resistive memory cell array 1500. For example, the resistive memory cells of each resistive memory cell layer may be single-level cells or multi-level cells. The cell types of the resistive memory cells included in a single layer may be the same. For example, the single-level cell may have one of two voltage levels or one of two resistances to store data of one bit (e.g., "0" or "1"), and the multi-level cell may have one of four voltage levels or one of four resistances to store data of two bits (e.g., "00", "01", "10" or "11").

The resistive memory device 1000 may operate some of the resistive memory cell layers in the single-level cell mode, and may operate the others of the resistive memory cell layers in the multi-level cell mode by using the control circuit 1200. For example, the resistive memory device 1000 may have four resistive memory cell layers stacked on the semiconductor substrate. One resistive memory cell layer located directly on the semiconductor substrate may be set to the single-level cell mode, and three resistive memory cell layers stacked on the lower resistive memory cell layer may be set to the multi-level cell mode.

As described above, the resistive memory device 1000 having the stacked structure according to some embodiments may selectively set each resistive memory cell layer to the single-level cell mode or the multi-level cell mode. Therefore, memory usage efficiency may be improved.

Figure 2:
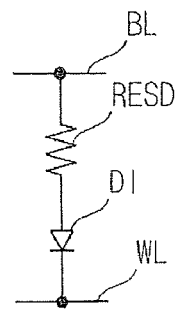
FIG. 2 is a diagram illustrating an example of a resistive memory cell for the resistive memory device of FIG. 1 according to some embodiments.

FIG. 2 is a diagram illustrating an example of a resistive memory cell for the resistive memory device of FIG. 1. Referring to FIG. 2, a memory cell may include a resistive element RESD and a diode D1 coupled in series between a bitline BL and a wordline WL. A resistance distribution of the resistive element RESD may be determined by controlling voltages applied to the bitline BL and the wordline WL. The write operation may be performed by applying the voltages to the bitline BL and the wordline WL, thereby controlling a voltage difference between both ends of the resistive element RESD or controlling a current flowing through the resistive element RESD.

Figure 3:
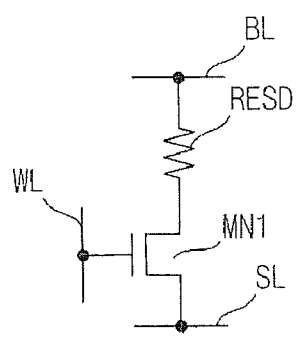
FIG. 3 is a diagram illustrating another example of a resistive memory cell for the resistive memory device of FIG. 1 according to further embodiments.

FIG. 3 is a diagram illustrating another example of a resistive memory cell for the resistive memory device of FIG. 1. Referring to FIG. 3, a memory cell may include a resistive element RESD and a switching element, such as a transistor MN1, coupled in series between a bitline BL and a source line SL. A gate of the transistor MN1 is coupled to a wordline WL. A resistance distribution of the resistive element RESD may be determined by controlling voltages applied to the bitline BL and the source line SL. A write operation may be performed by applying the voltages to the bitline BL and the source line SL, thereby controlling a voltage difference between the ends of the resistive element RESD and a current flowing through the resistive element RESD. Respectively, the memory cells of FIG. 2 and FIG. 3 may be classified as a unidirectional resistive memory cell where its resistance changes depending on the magnitude of the applied voltage or current and a bidirectional resistive memory cell where its resistance changes depending on the direction as well as the magnitude of the applied voltage or current.

Figure 4:
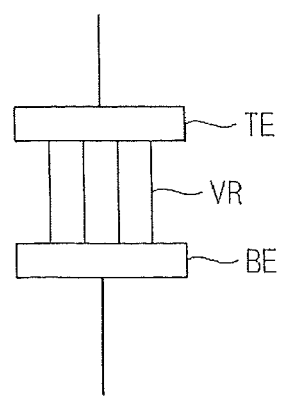
FIG. 4 is a diagram illustrating an example of a resistive element for the resistive memory cell of FIGS. 2 and 3 according to additional embodiments.

FIG. 4 is a diagram illustrating a resistive element for the resistive memory cells of FIGS. 2 and 3 according to some embodiments. Referring to FIG. 4, a resistive element RESD1 may include a top electrode TE, a bottom electrode BE and resistive material VR between the electrodes TE and BE. The electrodes TE and BE may include a metal, such as tantalum (Ta), platinum (Pt), etc. The resistive material VR may include a transition-metal oxide, such as cobalt oxide.

Figure 5:
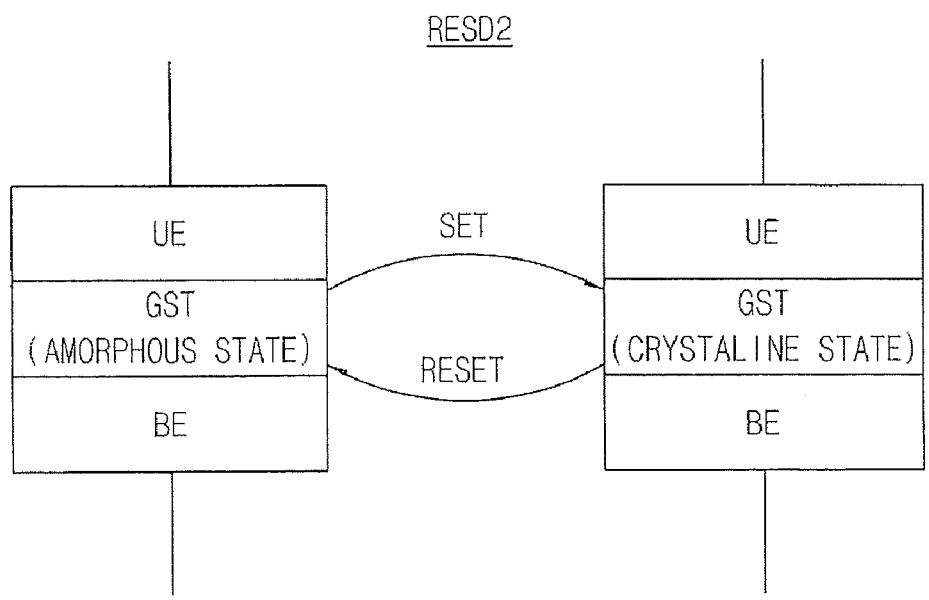
FIG. 5 is a diagram illustrating another example of a resistive element for the resistive memory cell of FIGS. 2 and 3 according to still further embodiments.

FIG. 5 is a diagram illustrating another example of a resistive element for the resistive memory cells of FIGS. 2 and 3. Referring to FIG. 5, a resistive element RESD2 may include a top electrode TE, a bottom electrode BE and resistive material between the electrodes TE and BE. The electrodes TE and BE may include a metal, such as tantalum (Ta), platinum (Pt), etc. The resistive material may include phase change material, such as GeSbTe (GST). The phase change material may be in amorphous state of relatively high resistance or in crystalline state of relatively low resistance depending on heating time and/or heating temperature applied thereto, i.e., the phase change material may change its resistance according to the phase of the material.

Figure 6:
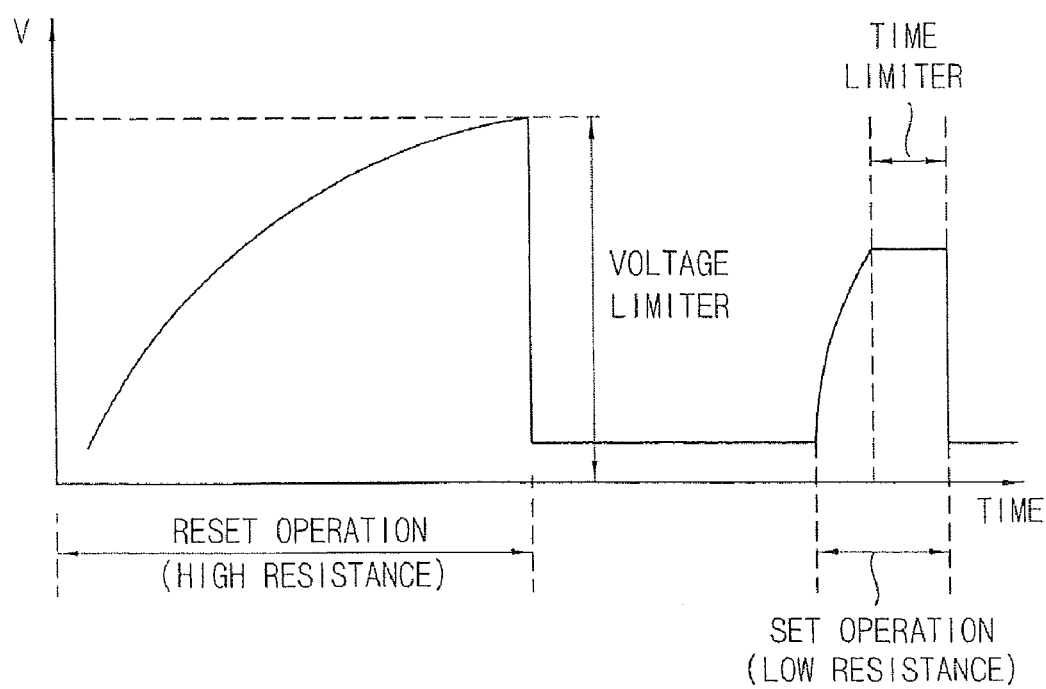
FIG. 6 is a diagram illustrating a voltage applied to a resistive memory cell including the resistive element of FIG. 4 according to some embodiments.

FIG. 6 is a diagram illustrating a voltage applied to a resistive memory cell including the resistive element of FIG. 4. For example, the voltage illustrated in FIG. 6 may be a bitline voltage for applying a voltage difference between both ends of a memory cell. Referring to FIG. 6, the bitline voltage has different waveforms during a reset operation and a set operation. As illustrated in FIG. 6, a reset operation may be defined as changing a state of a memory cell from the crystalline state of relatively low resistance to the amorphous state of relatively high resistance, and a set operation may be defined as changing a state of a memory cell from the amorphous state of relatively high resistance to the crystalline state of relatively low resistance. The converse may be true in other embodiments, i.e., a reset operation may be defined as changing a state of a memory cell from the amorphous state of relatively high resistance to the crystalline state of relatively low resistance, and a set operation may be defined as changing a state of a memory cell from the crystalline state of relatively low resistance to the amorphous state of relatively high resistance. In some embodiments, voltage limiter is applied during the reset operation and time limiter is applied during the set operation.

Figure 7:
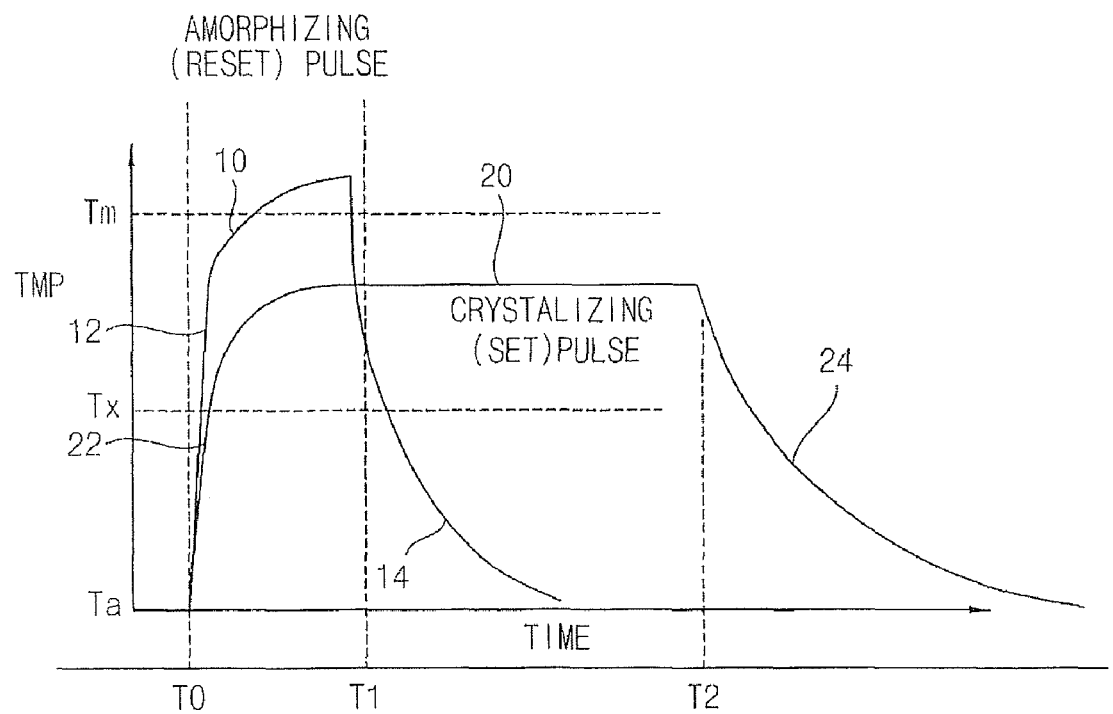
FIG. 7 is a diagram illustrating a phase change characteristic of the resistive element of FIG. 5 according to some embodiments.

FIG. 7 is a diagram illustrating a phase change characteristic of the resistive element of FIG. 5. In FIG. 7, the horizontal axis represents time (TIME) and the vertical axis represents temperature (TMP). Referring to FIG. 7, waveforms 12, 10 and 14 correspond to temperature changes that occur by applying an amorphizing (reset) pulse, and waveforms 22, 20 and 24 correspond to temperature changes that occur by applying a crystallizing (set) pulse. The amorphous state of phase change material (GST) may be obtained by heating the GST to a temperature over a melting temperature Tm and then rapidly cooling the GST. The crystalline state of phase change material (GST) may be obtained by heating the GST to a temperature over a crystallization temperature Tx and then cooling the GST. Hereinafter, a reset-write operation or a reset operation is defined as changing the state of the resistive element of FIG. 5 from the crystalline state to the amorphous state, and a set-write operation or a set operation is defined as changing the state from the amorphous state to the crystalline state.

Figure 8:
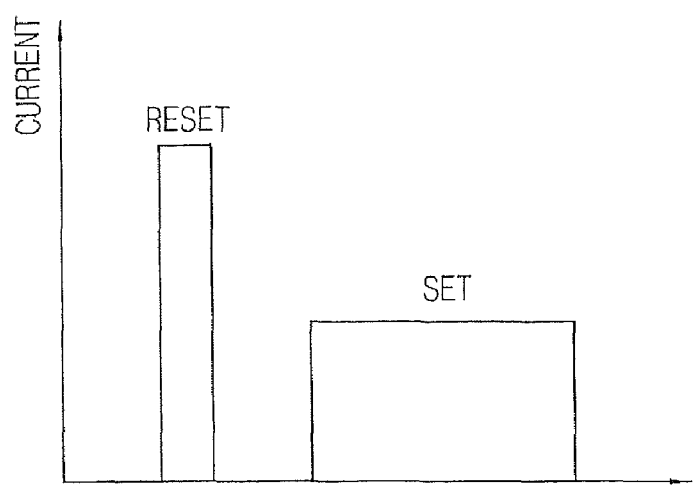
FIG. 8 is a diagram illustrates application of current pulses to a resistive memory cell including the resistive element of FIG. 5 according to some embodiments.

FIG. 8 is a diagram illustrating current pulses applied to a resistive memory cell including the resistive element of FIG. 5, for controlling the phase change characteristic of the resistive element of FIG. 7. In FIG. 8, the horizontal axis represents time (TIME) and the vertical axis represents current (CURRENT). Referring to FIG. 8, a current level of a reset pulse RESET for performing the reset-write operation is higher than a current level of a set pulse SET for performing the set-write operation, and a pulse width of the reset pulse RESET is shorter than a pulse width of the set pulse SET. The reset pulse RESET and the set pulse SET represent current pulses applied for writing a data value "1" or "0" into a memory cell.

Figure 9:
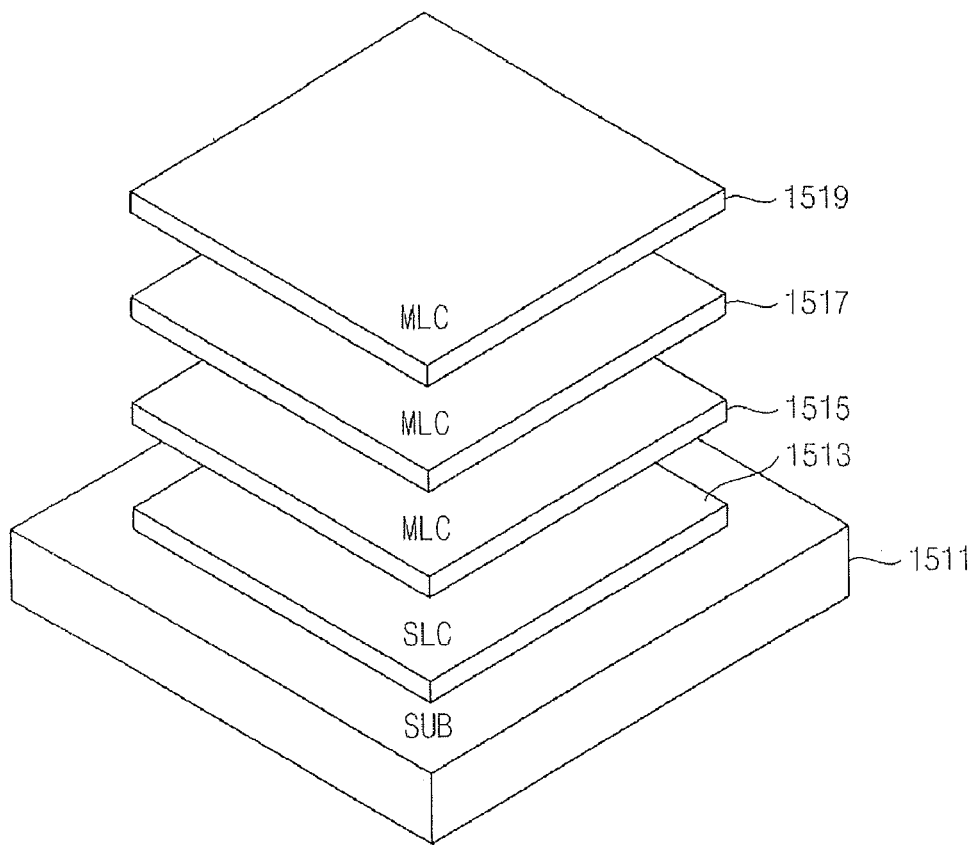
FIG. 9 is a perspective view of an example of the resistive memory device having a stacked structure according to some embodiments.

FIG. 9 is a perspective view of an example of the resistive memory device having a stacked structure as discussed above with reference to FIG. 1. Referring to FIGS. 1 and 9, a stacked structure 1510 for a memory device includes a semiconductor substrate 1511, a single-level cell layer 1513, a first multi-level cell layer 1515, a second multi-level cell layer 1517 and a third multi-level cell layer 1519. Each of the stacked resistive memory cell layers 1513, 1515, 1517 and 1519 may be set to a single-level cell mode or a multi-level cell mode.

The multi-level cell mode may be employed in an application where relatively high density is required, and the single-level cell mode may be employed in an application where relatively high reliability is required, for example, to store significant codes or data. In some embodiments, a resistive memory cell layer 1513 located directly on the semiconductor substrate 1511 may be set to the single-level cell mode due to a process condition, or the like.

While the stacked structure 1510 is described as including one single-level cell layer 1513 and three multi-level cell layers 1515, 1517 and 1519 stacked on the semiconductor substrate 1511, any number of single-level cell layers and any number of multi-level cell layers may be used. Further, the single-level cell mode or the multi-level cell mode of the resistive memory cell layers 1513, 1515, 1517 and 1519 may be determined in an arbitrary order.

Figure 10:
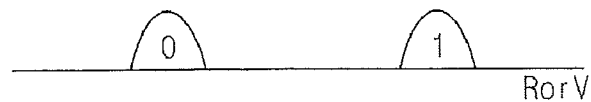
FIG. 10 is a diagram illustrating data storage for a single-level cell for the resistive memory device of FIG. 9 according to some embodiments.
Figure 11:
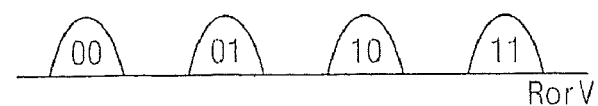
FIG. 11 is a diagram illustrating an example of data storage for a multi-level cell in the resistive memory device of FIG. 9 according to further embodiments.

FIG. 10 is a diagram illustrating an example of data stored in a single-level cell in the resistive memory device of FIG. 9, and FIG. 11 is a diagram illustrating an example of data stored in a multi-level cell in the resistive memory device of FIG. 9. As described above, the resistive memory device 1000 may set each resistive memory cell layer to the single-level cell mode or the multi-level cell mode. Referring to FIG. 10, a single-level cell may have one of two voltage levels or one of two resistances to store data of one bit (e.g., "0" or "1"). Referring to FIG. 11, a multi-level cell may have, for example, one of four voltage levels or one of four resistances to store data of two bits (e.g., "00", "01", "10" or "11"). The data may be sensed based on the voltage levels or the resistance of the memory cell.

Figure 12:
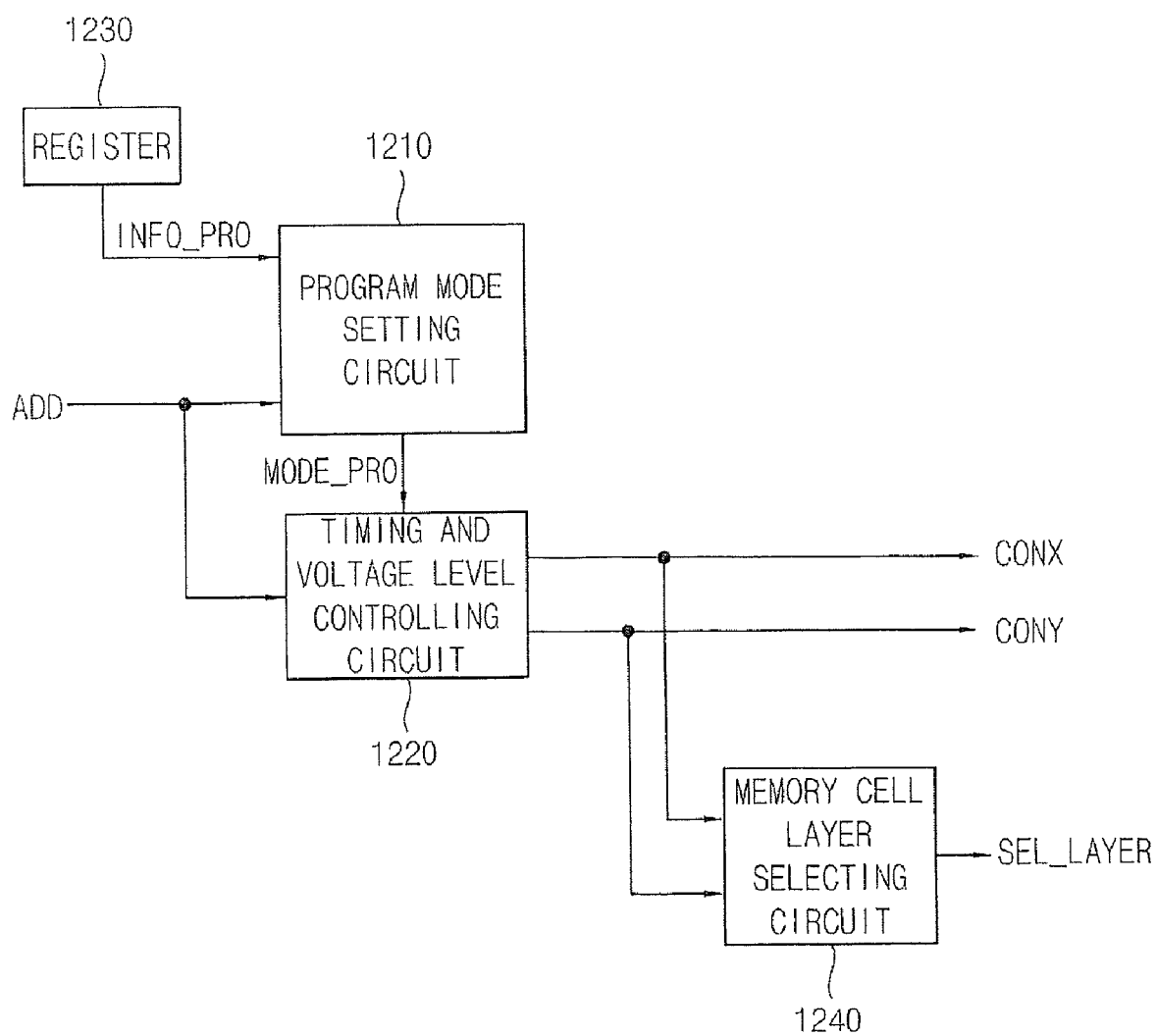
FIG. 12 is a block diagram illustrating a control circuit for the resistive memory device of FIG. 1 according to some embodiments.

FIG. 12 is a block diagram illustrating an example of a control circuit for the resistive memory device of FIG. 1. Referring to FIG. 12, a control circuit 1200 includes a program mode setting circuit 1210, a timing and voltage level control circuit 1220, a register 1230 and a memory cell layer selecting circuit 1240.

The register 1230 stores program information INFO_PRO. The program information INFO_PRO may be provided from a memory controller external to a resistive memory device. Alternatively, the program information INFO_PRO may be read from a stacked memory cell array in the resistive memory device.

The program mode setting circuit 1210 generates a program mode signal MODE_PRO indicating a program mode of a selected resistive memory cell layer based on an address signal ADD from the memory controller and the program information INFO_PRO from the register 1230. The program mode setting circuit 1210 may select the resistive memory cell layer based on the address signal ADD, may read the program information INFO_PRO from the register 1230, and may generate the program mode signal MODE_PRO for the selected layer corresponding to the address signal ADD based on the read program information INFO_PRO.

The timing and voltage level control circuit 1220 generates a row control signal CONX and a column control signal CONY based on the address signal ADD from the memory controller and the program mode signal MODE_PRO from the program mode setting circuit 1210. The timing and voltage level control circuit 1220 may generate the row control signal CONX and the column control signal CONY such that the input/output circuit 1100, the row decoder 1400 and the column decoder 1450 illustrated in FIG. 1 may operate with timing and voltage levels corresponding to a single-level cell mode or a multi-level cell mode.

The memory cell layer selecting circuit 1240 generates a layer selection signal SEL_LAYER indicating the selected resistive memory cell layer based on the row control signal CONX and the column control signal CONY. The memory cell layer selecting circuit 1240 may generate the layer selection signal SEL_LAYER based on address information included in the row control signal CONX and the column control signal CONY. In some embodiments, the control circuit 1200 may be implemented without the memory cell layer selecting circuit 1240, and the program mode setting circuit 1210 may generate the layer selection signal SEL_LAYER. While the register 1230 is illustrated as included in the control circuit 1200, the register 1230 may be located at the outside of the control circuit 1200.

Figure 13:
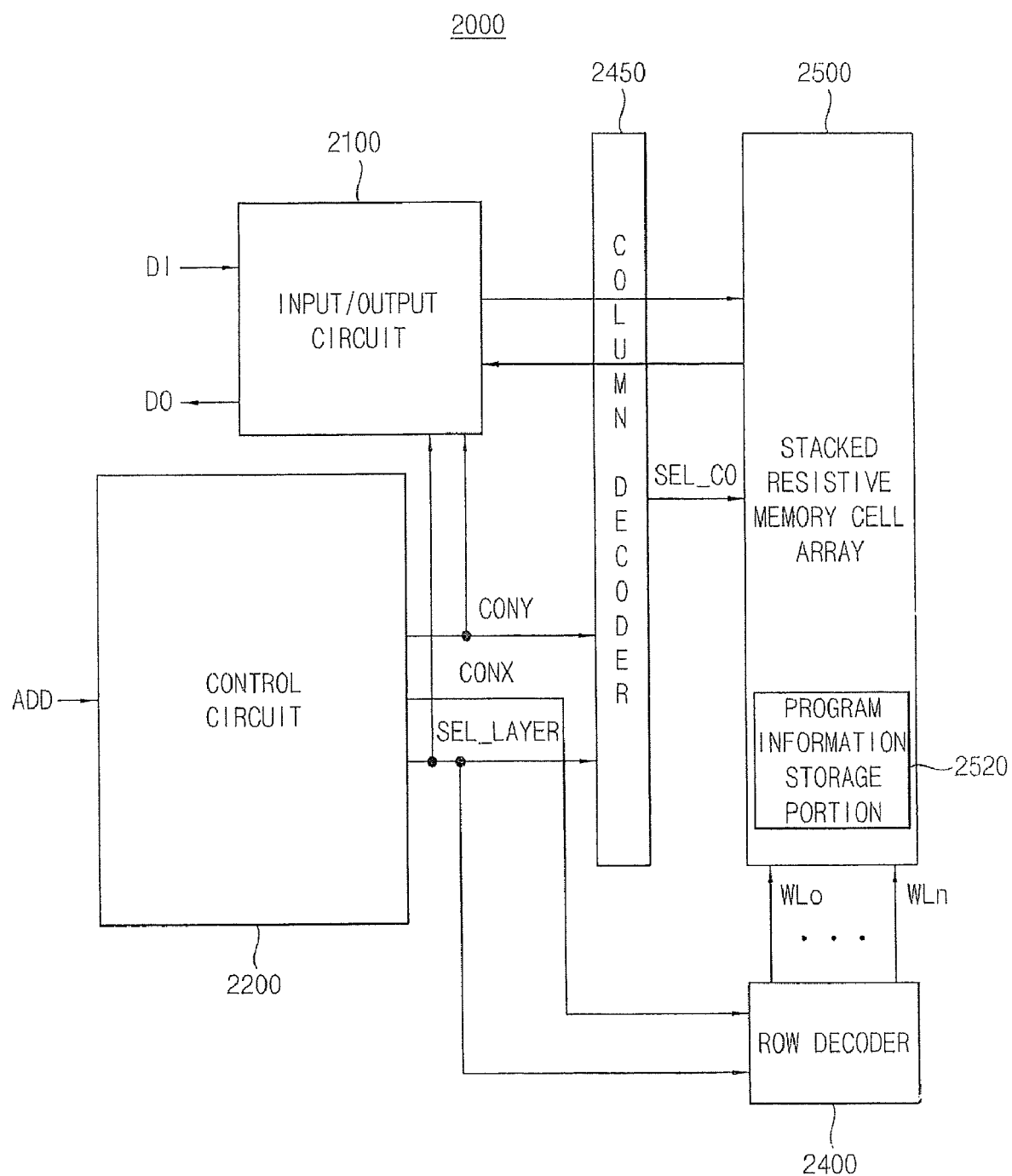
FIG. 13 is a block diagram illustrating a resistive memory device having a stacked structure according to additional embodiments.

FIG. 13 is a block diagram illustrating a resistive memory device having a stacked structure according to further embodiments. Referring to FIG. 13, a resistive memory device 2000 includes an input/output circuit 2100, a control circuit 2200, a row decoder 2400, a column decoder 2450, and a resistive memory cell array 2500. The resistive memory cell array 2500 includes a program information storage portion 2520.

The resistive memory cell array 2500 has a stacked structure including a plurality of resistive memory cell layers stacked on a semiconductor substrate. A specific area in at least one resistive memory cell layer may be used as the program information storage portion 2520 for storing program information. The program information may be information about program modes of the resistive memory cell layers. Since the resistive memory cell array 2500 is a nonvolatile memory cell array, the program information storage portion 2520 may maintain the stored program information even though power is off.

The control circuit 2200 reads the program information from the program information storage portion 2520. The control circuit 2200 may read the program information during an initialization process, and may store the read program information. The control circuit 1200 may select one resistive memory cell layer from the resistive memory cell layers in response to an address signal ADD, and may extract a program mode of the selected resistive memory cell layer from the program information. The control circuit 2200 may generate a row control signal CONX and a column control signal CONY based on the program mode of the selected resistive memory cell layer and the address signal ADD. The control circuit 2200 may generate a layer selection signal SEL_LAYER indicating the selected resistive memory cell layer.

The row decoder 2400 may generate wordline driving signals WL0 through WLn by decoding the row control signal CONX and the layer selection signal SEL_LAYER, and may apply the wordline driving signals WL0 through WLn to the selected resistive memory cell layer in the resistive memory cell array 2500. The column decoder 2450 may generate a column selection signal SEL_CO by decoding the column control signal CONY and the layer selection signal SEL_LAYER, and may apply the column selection signal SEL_CO to the selected resistive memory cell layer in the resistive memory cell array 2500.

The input/output circuit 2100 may include a sense amplifier and a write driver. The input/output circuit 2100 may provide input data DI to the selected resistive memory cell layer in the resistive memory cell array 2500 in response to the column control signal CONY and the layer selection signal SEL_LAYER during a write operation. The input/output circuit 2100 may generate output data DO by sensing and amplifying bitline voltages from the selected resistive memory cell layer in response to the column control signal CONY and the layer selection signal SEL_LAYER during a read operation.

In some embodiments, the program information stored in the program information storage portion 2520 may be a start address of a multi-level cell start layer that is set to a multi-level cell mode. For example, one or more resistive memory cell layers to which addresses less than the start address are assigned may be used as single-level cell layers, and one or more resistive memory cell layers to which addresses no less than the start address are assigned may be used as multi-level cell layers. The control circuit 2200 may have a configuration similar to a configuration of a control circuit 1200 of FIG. 12.

Figure 14:
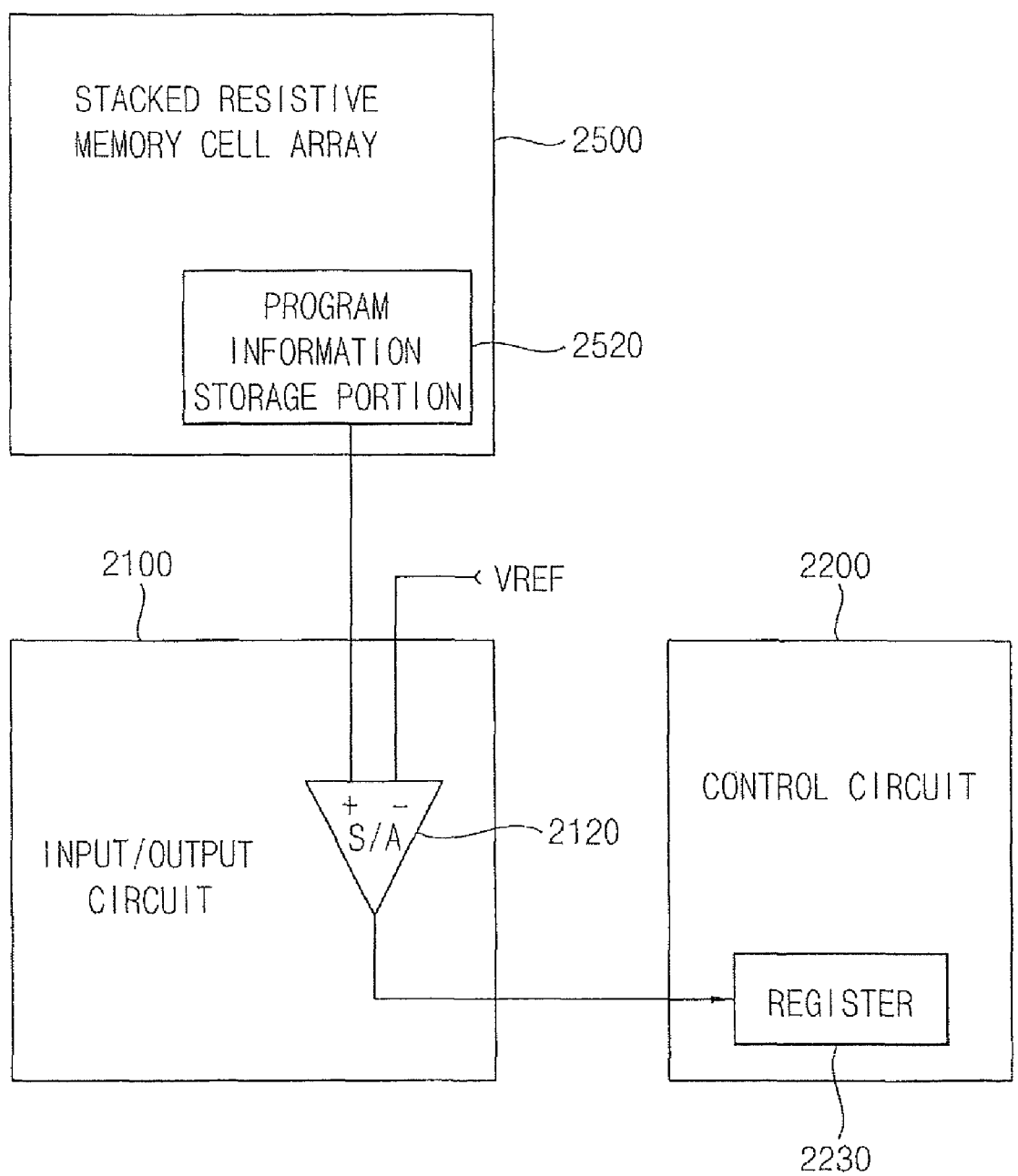
FIG. 14 is a block diagram illustrating reading of program information from a program information storage circuit to a control circuit according to some embodiments.

FIG. 14 is a block diagram illustrating reading of program information from a program information storage portion to a control circuit. Referring to FIG. 14, a program information storage portion 2520 included in a resistive memory cell array 2500 stores program information representing whether each resistive memory cell layer is programmed in a single-level cell mode or in a multi-level cell mode. A sense amplifier 2120 included in an input/output circuit 2100 may read the program information from the program information storage portion 2520, and may compare the program information with a reference voltage VREF to provide the program information to a register 2230 included in a control circuit 2200. The control circuit 2200 may generate a program mode signal based on an address signal and the program information. The control circuit 2200 may generate a row control signal, a column control signal and a layer selection signal based on the address signal and the program mode signal.

Figure 15:
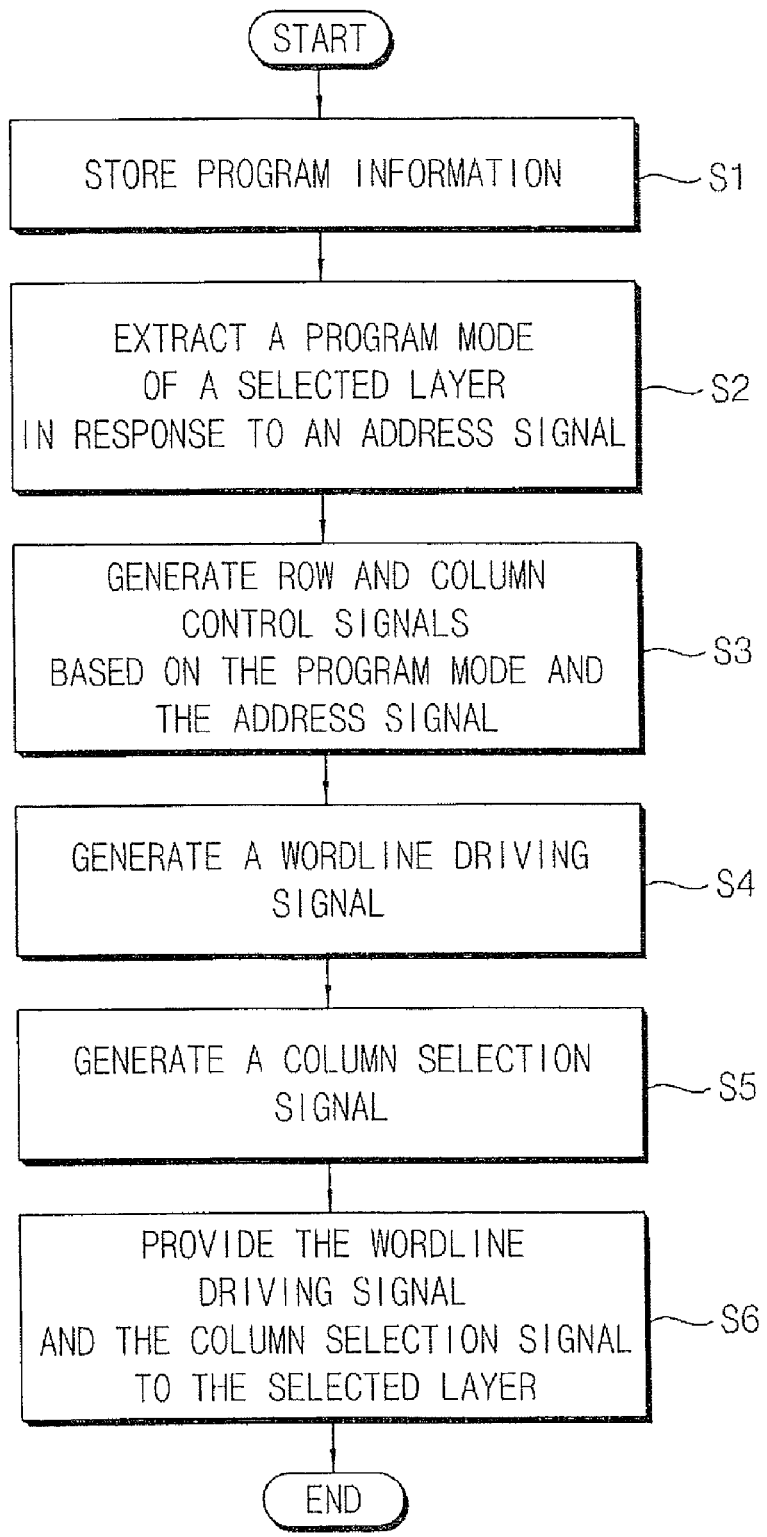
FIGS. 15 and 16 are flow charts illustrating operations of a resistive memory device having a stacked structure according to some embodiments.
Figure 16:
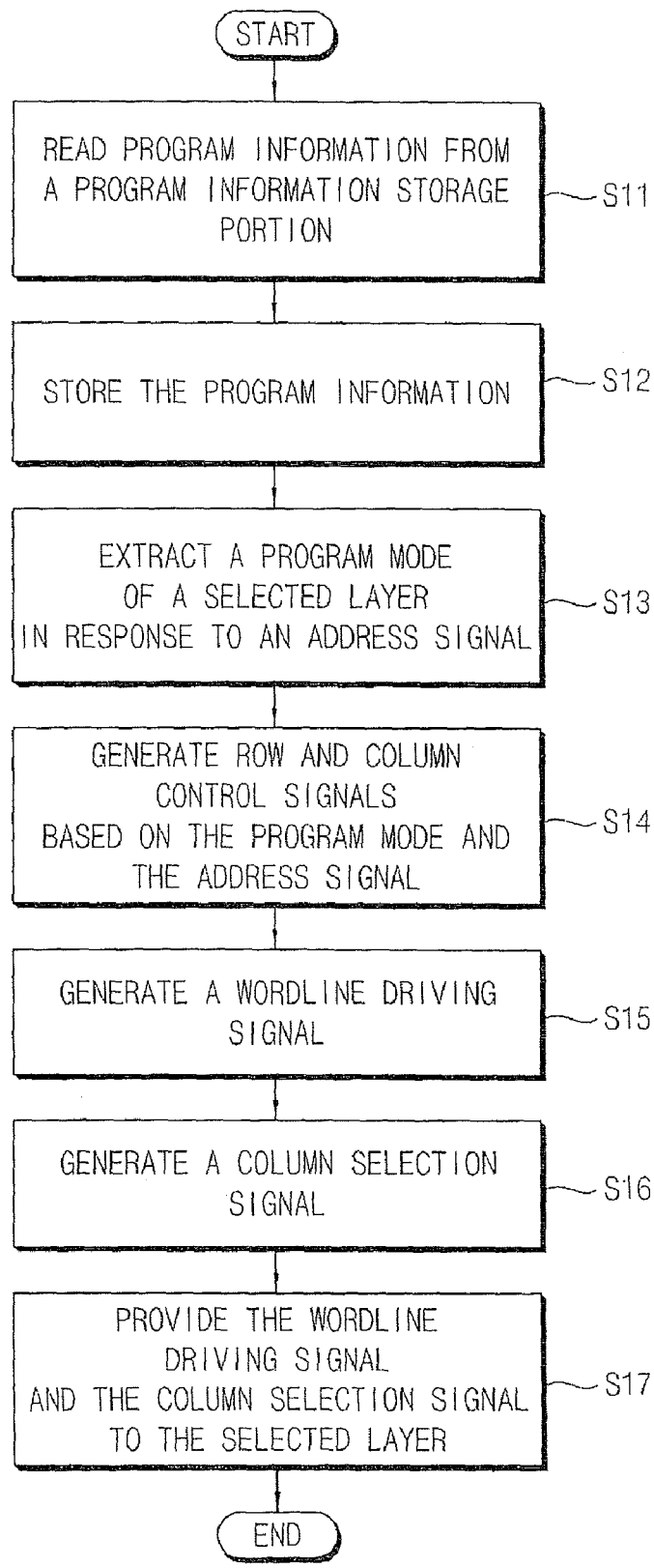

FIGS. 15 and 16 are flow charts illustrating operations for setting cell types of resistive memory cell layers in a resistive memory device having a stacked structure according to some embodiments. Referring to FIG. 15, program information about program modes of resistive memory cell layers may be stored in a register of a control circuit (Step S1). One layer may be selected from the resistive memory cell layers in response to an address signal, and a program mode of the selected layer may be extracted based on the stored program information (Step S2). A row control signal and a column control signal may be generated based on the program mode of the selected layer and the address signal (Step S3). A layer selection signal indicating the selected layer may be generated based on the row control signal and the column control signal. A wordline driving signal corresponding to the program mode of the selected layer may be generated by decoding the row control signal and the layer selection signal (Step S4). A column selection signal corresponding to the program mode of the selected layer may be generated by decoding the column control signal and the layer selection signal (Step S5). The wordline driving signal and the column selection signal may be applied to the selected layer in a resistive memory cell array (Step S6).

Referring to FIG. 16, program information about program modes of resistive memory cell layers may be read from a program information storage portion in a stacked resistive memory cell array (Step S11). The read program information may be stored in a register of a control circuit (Step S12). One layer may be selected from the resistive memory cell layers in response to an address signal, and a program mode of the selected layer may be extracted based on the stored program information (Step S13). A row control signal and a column control signal may be generated based on the program mode of the selected layer and the address signal (Step S14). A layer selection signal indicating the selected layer may be generated based on the row control signal and the column control signal. A wordline driving signal corresponding to the program mode of the selected layer may be generated by decoding the row control signal and the layer selection signal (Step S15). A column selection signal corresponding to the program mode of the selected layer may be generated by decoding the column control signal and the layer selection signal (Step S16). The wordline driving signal and the column selection signal may be applied to the selected layer in the stacked resistive memory cell array (Step S17). In the operations shown in FIG. 16, a portion of the stacked resistive memory cell array is used as the program information storage portion for storing the program information for resistive memory cell layers, which represents whether each resistive memory cell layer is programmed in a single-level cell mode or in a multi-level cell mode.

Figure 17:
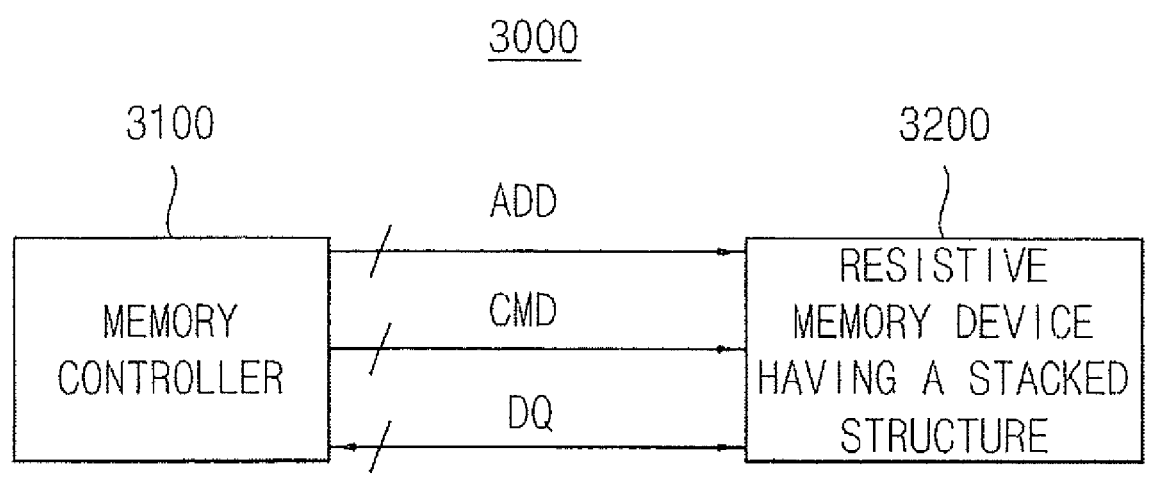
FIG. 17 is a block diagram illustrating a memory system including a resistive memory device according to further embodiments.

FIG. 17 is a block diagram illustrating a memory system including a resistive memory device according to some embodiments. Referring to FIG. 17, a memory system 3000 includes a memory controller 3100 and a resistive memory device 3200 having a stacked structure.

The memory controller 3100 generates an address signal ADD and a command signal CMD, and provides the address signal ADD and the command signal CMD to the resistive memory device 3200 through a bus. Data DQ indicates input data to be written into memory cells in the resistive memory device 3200 or output data read from the memory cells in the resistive memory device 3200.

The resistive memory device 3200 may have a configuration described with reference to FIGS. 1 through 16. The resistive memory device 3200 stores and outputs the data DQ in response to the address signal ADD and the command signal CMD. The resistive memory device 3200 may perform a write operation to store the input data, and may perform a read operation to provide the output data.

The resistive memory device 1000, 2000 and 3200 having a stacked structure according to some embodiments may program some of the resistive memory cell layers in a single-level cell mode, and may program the others of the resistive memory cell layers in a multi-level cell mode. For example, in a resistive memory device having four resistive memory cell layers stacked on a semiconductor substrate, one resistive memory cell layer located directly on the semiconductor substrate may be set to the single-level cell mode, and three resistive memory cell layers stacked on the resistive memory cell layer may be set to the multi-level cell mode.

The resistive memory device having a stacked structure according to some embodiments may include RRAM, PRAM or MRAM having a resistive memory cell array where each memory cell has a resistance that is varied depending on magnitude and/or direction of applied voltage or current.

As described above, a resistive memory device having a stacked structure according to some embodiments may selectively set Cell types of stacked resistive memory cell layers, thereby improving usage efficiency of a memory cell array and reducing a manufacturing cost.

The present inventive subject matter may be applicable to any semiconductor memory device and any memory system, and more particularly to a resistive memory device, such as RRAM, PRAM, MRAM, etc., and a memory system including the resistive memory device.

The foregoing is illustrative of some embodiments and is not to be construed as limiting thereof. Although a few some embodiments have been described, those skilled in the art will readily appreciate that many modifications are possible in the some embodiments without materially departing from the novel teachings and advantages of the present inventive subject matter. Accordingly, all such modifications are intended to be included within the scope of the present inventive subject matter as defined in the claims. Therefore, it is to be understood that the foregoing is illustrative of various some embodiments and is not to be construed as limited to the specific some embodiments disclosed, and that modifications to the disclosed some embodiments, as well as other some embodiments, are intended to be included within the scope of the appended claims.

What is claimed is:
1. A memory device comprising:
a stacked resistive memory cell array comprising a plurality of resistive memory cell layers stacked on a semiconductor substrate, wherein respective memory cell layers are configured to store data according to respective program modes comprising a single-level cell mode and a multi-level cell mode; and
a control circuit configured to identify a program mode of a selected memory cell layer responsive to an address signal and to access the selected memory cell layer responsive to the address signal according to the identified program mode,
wherein the control circuit is configured to store data in at least one first resistive memory cell layer located directly on the semiconductor substrate stores data in the single-level cell mode and to store data in a plurality of second resistive memory cell layers immediately overlying the at least one first resistive memory cell layer in the multi-level cell mode.

2. The memory device of claim 1, wherein the control circuit is configured to store program information for the plurality of memory cell layers and to identify the program mode of the selected memory cell layer based on the stored program information.

3. The memory device of claim 2, wherein the program information identifies an address corresponding to a program mode.

4. The memory device of claim 3, wherein the control circuit is configured to compare the address signal with the identified address to identify the program mode of the selected memory cell layer.

5. The memory device of claim 4, wherein the control circuit is configured to identify the program mode of the selected memory cell layer as a single-level cell mode if the address signal corresponds to an address less than the identified address and to identify the program mode of the selected memory cell layer as a multi-level cell mode if the address signal corresponds to an address greater than the identified address.

6. The memory device of claim 1, wherein the control circuit is configured to generate a row control signal and a column control signal responsive to the address signal and the identified program mode.

7. The memory device of claim 6, wherein the control circuit is configured to generate a layer selection signal indicating the selected memory cell layer to identify a single-level cell mode or a multi-level cell mode for the selected memory cell layer based on the row control signal, the column control signal and the layer selection signal.

8. The memory device of claim 7, further comprising:
a row decoder configured to generate a wordline driving signal corresponding to the program mode of the selected memory cell layer based on the row control signal and the layer selection signal and configured to apply the wordline driving signal to the selected memory cell layer; and
a column decoder configured to generate a column selection signal corresponding to the program mode of the selected memory cell layer based on the column control signal and the layer selection signal and to apply the column selection signal to the selected memory cell layer.

9. The memory device of claim 7, further comprising an input/output circuit configured to provide input data to the selected memory cell layer in the single-level cell mode or the multi-level cell mode in response to the column control signal and the layer selection signal during a write operation and to read output data from the selected memory cell layer in the single-level cell mode or the multi-level cell mode in response to the column control signal and the layer selection signal during a read operation.

10. The memory device of claim 1, wherein the control circuit comprises:
a program mode setting circuit configured to generate a program mode signal indicating the program mode of the selected memory cell layer based on the address signal; and
a timing and voltage level control circuit configured to generate the row control signal and the column control signal based on the address signal and the program mode signal.

11. The memory device of claim 10, wherein the control circuit further comprises a memory cell layer selecting circuit configured to generate a layer selection signal indicating the selected memory cell layer based on the row control signal and the column control signal.

12. The memory device of claim 1, wherein the stacked resistive memory cell array comprises a program information storage portion configured to store program information about the program modes of the resistive memory cell layers, and wherein the control circuit is configured to access the program information storage portion to identify the program mode of the selected memory cell layer.

13. A memory system comprising:
a memory controller configured to generate an address signal; and
a resistive memory comprising a plurality of resistive memory cell layers stacked on a semiconductor substrate, respective ones of the memory cell layers configured to store data according to respective program modes comprising a single-level cell mode and a multi-level cell mode, the resistive memory further configured to identify a program mode of a selected memory cell layer responsive to the address signal and to access the selected memory cell layer responsive to the address signal according to the identified program mode,
wherein at least one first resistive memory cell layer located directly on the semiconductor substrate stores data in the single-level cell mode and at least one second resistive memory cell layer immediately overlaying the at least one first resistive memory cell layer stores data in the multi-level cell mode.

14. A method of operating a resistive memory comprising a plurality of resistive memory cell layers stacked on a semiconductor substrate, respective ones of the memory cell layers configured to store data according to respective program modes comprising a single-level cell mode and a multi-level cell mode, the method comprising:
identifying a program mode of a selected memory cell layer responsive to an address signal; and
accessing the selected memory cell layer responsive to the address signal according to the identified program mode,
wherein accessing the selected memory cell layer comprises:
storing data in at least one first resistive memory cell layer located directly in the semiconductor substrate in the single-level mode; and
storing data in at least one second resistive memory cell layer immediately overlaying the at least one first resistive memory cell layer in the multi-level cell mode.

15. The method of claim 14, wherein identifying a program mode of a selected memory cell layer responsive to an address signal comprises accessing program information stored in the resistive memory device responsive to the address signal.

16. The method of claim 14, wherein the program information is stored in the plurality of memory cell layers or in a register.

17. The method of claim 15, wherein the program information comprises an address associated with a program mode.

* * * * *